(12) United States Patent
Nielsen

(10) Patent No.: US 6,653,909 B2
(45) Date of Patent: Nov. 25, 2003

(54) DIGITAL SIGNALS, RADIO TRANSMITTER CIRCUITS AND METHOD

(75) Inventor: Per Asbeck Nielsen, Copenhagen (DK)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 10/014,402

(22) Filed: Dec. 14, 2001

(65) Prior Publication Data

US 2003/0020557 A1 Jan. 30, 2003

(30) Foreign Application Priority Data

Dec. 15, 2000 (GB) .............................. 0030684

(51) Int. Cl.[7] .................................. H03C 5/00
(52) U.S. Cl. ........................ 332/151; 455/102
(58) Field of Search ...................... 332/103–105, 332/108, 151–154; 375/298, 302; 455/95, 102, 108, 110

(56) References Cited

U.S. PATENT DOCUMENTS 6,396,341 B1 * 5/2002 Pehlke ...................... 330/10

* cited by examiner

*Primary Examiner*—David C. Mis
(74) *Attorney, Agent, or Firm*—Antonelli, Terry, Stout & Kraus, LLP

(57) ABSTRACT

The invention is a radio transmitter and a method for transforming digital amplitude as well as phase or frequency modulation information into analog signals for controlling analog amplifier circuitry. The method includes providing first and second digital signals representing phase angle; converting the signals into analog signals; mixing the analog signals with oscillator signals to obtain an analog, modulated signal; providing a third digital signal corresponding to amplitude; converting this signal into an analog signal; and feeding the analog, modulated signal and said analog signal to the analog amplifier circuitry.

20 Claims, 3 Drawing Sheets

DIGITAL SIGNALS, RADIO TRANSMITTER CIRCUITS AND METHOD

BACKGROUND OF THE INVENTION

Field of the Invention

The invention relates to radio transmitters for transmitting radio signals which vary in amplitude as well as in phase or frequency.

From the article: Asad A. Abidi: "Low-Power Radio-Frequency ICs for Portable Communications", Proceedings of the IEEE, Vol. 83 No. 4, April 1995, pp. 544–569, radio transmitters are known, for example in mobile telephones, where signals representing a desired transmitted radio signal are processed in a Digital Signal Processor and delivered from the processor to a transmitter radio frequency (RF) output unit as digital signals in quadrature form; compare for example FIG. 13.

It is a disadvantage in the transmitters thus known that the non-linearities of the power amplifier distort the transmitted signal.

From the article: V. Petrovic: "Reduction of Spurious Emission from Radio Transmitters by Means of Modulation Feedback", IEE Conference on Radio Spectrum Conservation Technique, September 1983, pp. 44–49, a Single-Sideband (SSB) Radio Transmitter is known, in which two output quadrature signals are generated from the output RF signal, and two input quadrature signals are generated from an input signal as well. The quadrature output signals are demodulated by two quadrature carrier signals generated digitally, and are fed back and compared with the input quadrature signals. Difference quadrature signals are amplified and modulated with the carrier signals and summed to form the output RF signal.

It is a disadvantage in this known transmitter that the input quadrature signals are generated from a complete, modulated input signal by means of a phase-shift circuit. The article mentions the difficulties experienced when designing a reliable wide-band 90° phase-shift network.

From the article: Hiroaki Kosugi et al.: "A High-Efficiency Linear Power Amplifier Using an Envelope Feed-Back Method", Electronics and Communication in Japan, Part 2, Vol. 77, No. 3, 1994, pp. 50–57, a Power Amplifier is known, in which input signals are fed to a power amplifier in quadrature form, that is generated by a quadrature mixer not specified in detail. An envelope signal is derived mathematically from the input quadrature signals, and is used as independent variable in an envelope feed-back loop controlling the envelope of the power output signal. No phase feed-back is disclosed.

It is a disadvantage in this known amplifier that the phase distortion of the power amplifier is not controlled or overcome.

From the article: Leonard R. Kahn: "Single-Sideband Transmission by Envelope Elimination and Restoration", Proceedings of the I.R.E., 1952, pp. 803–806, an SSB Transmitter is known, wherein the phase and the amplitude components of an input signal are separated and amplified independently before being combined in a final output stage.

It is a serious disadvantage in this transmitter that modulating the amplitude at a high power level tends to generate considerable amounts of spurious signals.

From the article: V. Petrovic & W. Gosling: "Polar-Loop Transmitter", Electronics Letters, 10 May 1979 Vol. 15 No. 10, pp. 286–288, a Polar Modulation Feedback Linearisation System for an SSB Transmitter is known, wherein the modulated output from a Radio Frequency Power Amplifier (RF PA) is being controlled by means of two closed loops, each having the same modulated Intermediate Frequency (IF) Signal as the controlling variable. A first loop controls the Amplitude Modulation (AM) or the "envelope" of the RF output signal relative to the IF signal, and a second loop controls the Phase Modulation (PM) of the RF output signal relative to the IF signal. Polar representation of the RF signal vector is used in the article, the vector angle representing the signal phase and the vector magnitude representing the signal amplitude.

Thus, this polar modulation feedback linearization system uses a fully modulated IF signal which is demodulated into an amplitude signal and a phase signal, respectively. It is a disadvantage that the analog control signals for the amplitude and phase loops thus have to be extracted from the IF signal.

SUMMARY OF THE INVENTION

The invention provides a digital signal set containing amplitude as well as phase or frequency modulation information, the signal set enabling transfer of this information from a digital domain to an analog domain in an efficient way, the signals being comparatively easily generated in the digital domain and at the same time being suited for conversion into an analog signal set in a way reducing efficiently the risk of "cross-talk" between the amplitude modulation and the phase or frequency modulation, and enabling a very efficient linearisation of a simple and energy-efficient analog output stage in a radio transmitter.

The invention provides a set of digital signals; a radio transmitter; and a method for transforming modulation information from a digital signal processing system into analog signals for controlling analog modulator and amplifier circuitry.

In a digital signal set containing amplitude as well as phase or frequency modulation information for compound modulating a carrier wave, the set comprises the following three digital signals:

a first and a second digital signal representing a desired phase angle of the carrier wave; and a third digital signal representing a desired amplitude of the carrier wave.

Hereby, modulation information is provided which is suitable for driving particularly simple modulator circuits while obtaining high quality modulation with a minimum of cross-talk between the different types of modulation, while the information is still simple to establish in a digital signal processing system.

Cross-talk between the amplitude and phase or frequency modulation, respectively, is primarily being avoided due to the fact that the amplitude modulation information and the phase or frequency modulation information, respectively, are separated from one another in the digital domain, such that the digital-to-analog conversion may be made on the separated modulation information signals rather than on a compound signal containing both types of modulation information. Retrieval of the two types of modulation information from one and the same compound analog signal of the prior art will not be possible with state-of-the-art analog circuitry without the use of very elaborate and expensive circuits.

It is preferred that the first and second digital signals correspond to each their component of a desired phase unit vector in a Cartesian coordinate system.

Hereby, phase or frequency information is provided which is particularly suited for being transformed into analog phase or frequency information in a simple modulator circuit.

The invention provides a method for amplitude and phase or frequency modulating an output signal from an amplifier circuit such as a radio transmitter output stage, the method permitting efficient and component-saving use of contemporary digital signal processing systems together with analog aerial output circuitry and at the same time eliminating the disadvantages of the prior art.

A method for transforming modulation information from a digital signal processing system into analog signals suitable for controlling analog modulator and amplifier circuitry, the information comprising amplitude modulation information as well as phase or frequency modulation information for compound modulating a carrier wave, comprises the steps of:

providing a first and a second digital signal representing a desired phase angle of the carrier wave;

converting each of the first and second digital signals into corresponding first and second analog signals;

mixing the first and second analog signals with first and second oscillator signals to obtain an analog, phase or frequency modulated signal;

providing a third digital signal corresponding to the desired amplitude of the carrier wave;

converting the third digital signal into a corresponding analog amplitude signal; and feeding the analog phase or frequency modulated signal and the analog amplitude signal to said analog modulator and amplifier circuitry.

Hereby, analog signals containing the desired analog as well as phase or frequency modulation information have been provided by means of very simple circuitry, the signals having very low levels of amplitude distortion and phase or frequency distortion, respectively.

The three digital signals mentioned may easily be provided by a digital signal processing system of the state of the art when adequately programmed, even if constraints are put to the first and the second digital signal as to representing a phase or frequency vector of unity magnitude, or at least of a constant magnitude.

It is generally preferred that each of the first and second digital signals, or each of the first and second analog signals, respectively, correspond to a respective component of a desired phase unit vector in a Cartesian coordinate system.

In a cartesian coordinate system, an optimal discrimination or resolution of the phase information is obtained, relative to the discrimination or resolution of the components of the phase vector.

It is likewise preferred that the first and second oscillator signals are in quadrature.

By this measure, the local oscillator signals may be generated more easily with adequate precision, for example by frequency dividing a master oscillator square wave signal into two quadrature square wave signals, or by generating by means of a CR coupling and an RC coupling (resistance-capacitance couplings) a +45° and a −45° shifted sine wave from a master sine wave.

Preferably, the analog, phase or frequency modulated signal has a constant amplitude.

Hereby, any risk of amplitude noise from the phase or frequency modulated signal affecting or contaminating the amplitude modulation of the output signal is significantly reduced. In addition, a phase detector of a phase locked loop will perform better on a modulated signal having a constant amplitude.

The invention provides a radio transmitter corresponding to the digital signal set and the method of the invention.

A radio transmitter comprising a digital signal processing system as well as analog signal processing circuitry and an analog output stage, comprises:

first and second digital-to-analog conversion circuits for converting first and second digital quadrature signals from the digital signal processing system into corresponding first and second analog quadrature signals;

a first mixer circuit with an associated first local oscillator circuit for mixing the first and second analog quadrature signals with first and second quadrature signals from the local oscillator into a constant amplitude, phase or frequency modulated driver signal;

frequency converter circuitry for converting the driver signal to a desired output frequency band;

a power amplifier for amplifying the converted signal into a transmitter output signal;

a third digital-to-analog conversion circuit for converting a digital amplitude signal from the digital signal processing system into a corresponding analog amplitude signal; and an amplitude modulating circuit for modulating the amplitude of the transmitter output signal in dependency of the analog amplitude signal.

With the invention, simple modulator circuitry is obtained, in which the analog output stage may be supplied with digital modulation signals which are easily generated within the digital signal processor, while enabling modulation of the transmitter output signal with very low phase or frequency distortion.

It is generally preferred that the frequency converter circuitry together with the power amplifier forms part of a phase locked loop.

The advantages known per se of the phase locked loop enables full benefit to be had of the advantageous phase modulation circuitry of the invention; in particular, it enables a very high phase linearity of the output power amplifier, which tends to minimize any phase distortion arising from imperfections in the power amplifier, or from amplitude modulating the power amplifier.

It is further preferred that the frequency converter circuitry comprises in a main signal path a voltage controlled oscillator controlling a power amplifier, and in a feed-back path a divider circuit, or a second mixer circuit with an associated second local oscillator circuit.

This embodiment provides for a further simple and stable phase locked loop.

In a preferred embodiment, the amplitude modulating circuit comprises a closed amplitude control loop.

With the invention, the amplitude linearity of the analog circuitry is substantially improved.

In a particularly preferred embodiment, the power amplifier forms part of the amplitude control loop.

In this embodiment, the resulting amplitude linearity of the output stage I generally depends on characteristics of the amplitude control loop rather than characteristics of the power amplifier. This enables use of power amplifiers with less ideal amplitude linearity, and among such power amplifiers are particularly power efficient amplifiers. The use of such power efficient amplifiers are generally advantageous, and particularly so in battery powered equipment such as mobile equipment.

"Cross-talk" from the amplitude modulation to the phase or frequency modulation (or: phase or frequency distortion, respectively, generated by the amplitude modulation) in amplifiers processing compound modulated signals always is present to some small extent, due to the very fact that the shift of the amplifier gain introduced by the shift of the modulated amplitude in itself affects the momentary phase or frequency, respectively, of the signal.

Substantial cross-talk from the amplitude modulation to the phase or frequency which normally is encountered when using a power amplifier with a poor amplitude linearity for amplifying signals that are both amplitude and phase or frequency modulated, is however avoided in the embodiments of the invention with both an amplitude feedback loop and a phase locked loop, because the phase distortion generated from the amplitude modulated signal by the amplitude linearity defects of the power amplifier are cancelled by the phase linearity feedback of the phase locked loop.

This is so because the phase distortion is generated inside of the phase locked loop, and thus is a part of the circuit which is controlled by the phase locked loop.

Further, the invention provides an advantageous use of the digital signal set in a mobile radio transmitter, preferably a mobile radio transmitter in a cellular telephone.

This use makes possible a lower component count in the modulator circuitry of a mobile radio transmitter, thus providing for lower weight, lower price and lower power consumption.

Finally, the invention provides an advantageous use of the radio transmitter of the invention in mobile equipment, preferably a mobile, cellular telephone.

This use makes possible a lower component count and a higher power efficiency in the output stage with similar or better modulation quality, thus providing for lower weight, lower price, lower power consumption and higher signal quality.

Below, the invention is explained in more detail by means of embodiment examples and with reference to the drawings, in which corresponding reference designations refer to same or corresponding items, reference letters generally refer to signals and reference numerals generally refer to elements.

DETAILED DESCRIPTION OF THE INVENTION

Figure 1:
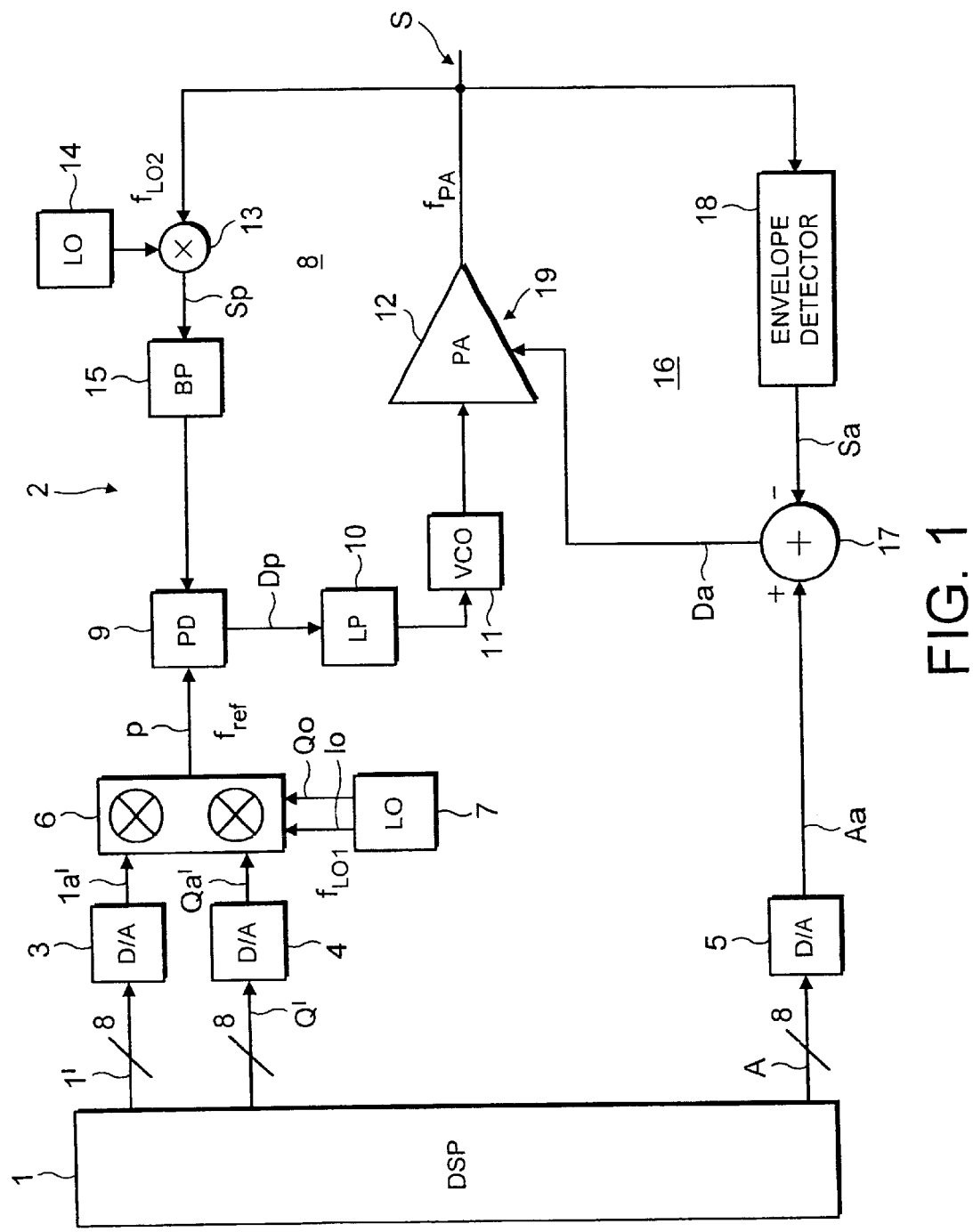
FIG. 1 schematically shows part of the circuitry in a radio transmitter according to the invention.

In FIG. 1, a digital signal processor 1 produces digital signals I', Q' and A containing modulation information. The digital signal processor communicates in a way not shown with other circuitry in the radio transmitter, such as signal providing circuitry.

In the embodiment shown, the digital signals I', Q', A are used for controlling an analog output stage 2. The analog output stage 2 produces an output signal S which is fed to an aerial.

According to one embodiment of the invention, the digital signals I' and Q' represent the Cartesian coordinates of a unit phase vector of the desired output signal S. In the embodiment shown, this is accomplished by the signal I' having a value proportional to cos $\Phi(t)$ and the signal Q' having a value proportional to sin $\Phi(t)$, $\Phi(t)$ being the momentary value of a desired phase shift of the phase modulated output signal S.

In this way, the value of $\Phi(t)$ designates the momentary phase value which is to be added to the phase of the carrier wave of the output signal S, in order to obtain the desired phase modulation of this signal. It is evident that the phase shift representation provided by the I' and Q' signals constitutes unambiguous information on the desired phase modulation of the output signal S, as long as the phase shift is kept within the interval of $-180°<\Phi(t)<180°$.

Phase and/or frequency modulation schemes are known for providing unambiguous phase information beyond the limits of this interval.

In the embodiment shown, the digital signal A represents the amplitude value of the output signal S.

Thus, the complete output signal S may be expressed as $S(t)=A(t)(Re[(I'(t)+jQ'(t))e^{j\omega_c t}])$; j being the imaginary unit, and $\Phi_c$ being the angular frequency of the carrier wave.

The digital signals I', Q' and A are preferably represented as n-bit words with the bits transmitted in parallel. In FIG. 1, the digital signals are represented as each their 8-bit word, transmitted on 8-wire lines. This does not, however, implicate that 8-bit words are required or preferred in any specific application. For example, words of 8 to 12 bits might be preferred for use in for example cellular telephone equipment.

Each 8-wire line in FIG. 1 runs to a digital-to-analog converter 3–5, where the respective digital signals are converted to analog voltage signals I'a, Q'a and Aa.

The two analog voltage signals I'a and Q'a are carried to a quadrature mixer 6 where these two signals are mixed with two signals Io and Qo from a local oscillator 7, operating at a frequency $f_{LO1}$. The two signals Io and Qo are in quadrature, i.e. phase shifted 90° respective to one another.

Such local oscillator signals may be generated easily with adequate precision, for example by frequency dividing a master oscillator square wave signal into two quadrature square wave signals, or by generating by means of a CR coupling and an RC coupling (resistance-capacitance couplings) a +45° and a −45° phase shifted sine wave from a master sine wave.

The output from the quadrature mixer 6 is a single analog phase signal P, having a fixed carrier frequency fref and being phase modulated with a phase shift corresponding to the phase of the virtual phase vector (I',Q').

In any case, the signal P is a constant magnitude signal (preferably a constant voltage signal) and thus free from any amplitude information and amplitude noise. The signal P may preferably be amplitude limited so as to ensure a constant magnitude, and reduce any possible amplitude noise.

The analog phase signal P is now used as reference input to a phase locked loop 8. The elements of this loop comprise:

a phase detector 9;

a low-pass filter 10;

a voltage controlled oscillator 11;

a power amplifier 12;

a feedback (or: down-conversion) mixer 13;

a local oscillator 14; and a band-pass filter 15.

The functioning of the phase locked loop 8 is preferably as follows:

The output signal S having the frequency $f_{PA}$ is carried to a mixer 13 where it is mixed with a local oscillator signal of frequency $f_{LO2}$ from a local oscillator 14, in order to obtain a signal Sp having the phase shift or offset of the output signal S, but at the frequency of the analog phase signal P. The signal Sp and the analog phase signal P are fed to a phase detector 9, detecting the phase difference between the signals P and Sp. A low-pass filter or preferably a band-pass filter 15 is coupled between the mixer 13 and the phase detector 9.

A phase difference signal Dp is carried via a low-pass filter 10 to a voltage controlled oscillator 11. This oscillator oscillates at a center frequency corresponding to the center frequency of the desired output signal, and its output signal is used as input signal to a power amplifier 12 providing the desired output signal S.

Thus, the voltage controlled oscillator 11 acts as a frequency converter circuit in that it provides the desired phase information (contained in the phase signal P) at a desired carrier frequency (that is, the center frequency of the voltage controlled oscillator 11).

The phase locked loop 8 is now closed, in that the signal S is carried to the mixer 13 as previously mentioned.

As the actual frequency of the voltage controlled oscillator 11 and hence the power amplifier 12 is now controllable by the phase difference signal Dp carried to the voltage controlled oscillator 11 via the low-pass filter 10, any phase difference between the analog phase signal P and the output signal S is minimised by the feedback in the phase locked loop 8.

Thus, the phase of the output signal S is the same as the phase of the analog phase signal P.

In another embodiment (not shown) of the phase loop of the invention, the feedback mixer 13, the local oscillator 14 and the band-pass filter 15 are replaced by a divider circuit, dividing down the output signal S from the frequency $f_{PA}$ to the frequency $f_{ref}$ of the quadrature mixer 6 and the phase detector 9. This completes and closes the phase lock loop as well, but the resulting phase shift of the output signal S is multiplied by the factor $f_{PA}/f_{ref}$ as compared to the signal P.

In this embodiment, therefore, the phase shift defined by the digital signals I' and Q' must be reduced by the factor $f_{PA}/f_{ref}$ as compared to the desired phase shift of the output signal S.

Returning to FIG. 1, the analog voltage signal Aa is used as reference input to an amplitude feedback loop 16. The elements of this loop comprise:

an analog difference element 17;

the power amplifier 12, provided with a gain control input 19; and an amplitude detector (or AM demodulator) 18.

The functioning of the amplitude feedback loop 16 is preferably as follows:

The output signal S is led to the amplitude detector 18. The output signal Sa from the detector 18 is now corresponding to the momentary amplitude of the output signal S.

The analog amplitude signal Aa and the detected amplitude Sa is compared in the analog difference element 17, and the difference Da is carried to the gain control input 19 of the power amplifier 12.

The amplitude feedback loop 16 is now closed, in that the signal Sa is carried to the amplitude detector 18 as mentioned above.

As the actual amplitude of the output signal S is now controllable by the amplitude difference signal Da, any amplitude disproportionality between the analog amplitude signal Aa and the output signal S is minimized by the feedback in the amplitude feedback loop 16.

Thus, the amplitude of the output signal S is controlled to be proportional to the amplitude of the analog amplitude signal Aa. In this way, the amplitude feedback loop 16 acts as an amplitude control loop or an amplitude modulating circuit, providing a desired modulated amplitude of the output signal S.

The output signal S is carried to an aerial by means not shown; these may include antenna tuning components or circuits.

By the measures thus explained, the use of comparatively simple analog modulator circuits is made possible, partly owing to a greater part of the processing of the modulating signals being carried out in the digital domain, preferably in the digital signal processor 1.

Further, phase and amplitude modulation information are kept entirely separate within the analog domain, except for the power amplifier 12, thus minimizing cross-talk between the phase and amplitude modulation from the digital signal processor 1 to the power amplifier 12.

By the very principle of having two feedback loops closed around the power amplifier 12, that is, the phase locked loop 8 and the amplitude feedback loop 16, amplitude distortion of the signals in the phase loop does not affect the output signal S significantly, and the phase variations of the output signal S do not affect the functioning of the amplitude feedback loop 16.

The provision of the digital signals I', Q' and A containing the phase and amplitude modulation information from an existing digital signal processing system is still simple, being mostly dependent on appropriate software.

An important advantage of the set of the three digital signals according to the invention is that the signals are more linear and less noisy than corresponding analog signals are, owing to the greater precision and less noise susceptibility of the circuits of the digital signal processor as compared to analog circuitry. Further, the kind of signal processing involved is handled more power efficiently and more precisely by the digital signal processor than by analog circuits.

If the necessary modulation information is available in the digital signal processor in the form of an I signal and a Q signal, that is, signals representing an actual phase-and-amplitude vector of the output signal S, the following transformation or calculations will provide the I' and the Q' signals of the present invention:

I and Q are the complex coordinates of a vector, whose angle with the real axis represents the desired phase shift and whose magnitude represents the desired amplitude of the output signal. Thus, $I(t)=A(t)\cos\Phi(t)$ and $Q(t)=A(t)\sin\Phi(t)$; $A(t)$ is the momentary amplitude and $\Phi(t)$ is the momentary value of a desired phase shift of the phase modulated output signal S.

From these signals $I(t)$ and $Q(t)$, the signal set of the invention may now be obtained by the following calculations:

$$A(t)=(I(t)^2+Q(t)^2)^{-1/2}$$

$$I'(t)=I(t)/A(t)$$

$$Q'(t)=Q(t)/A(t)$$

These calculations are easily and efficiently performed by a digital signal processor of the state of the art, and do not occupy significant amounts of signal processing power.

The power amplifier 12 having the gain control input 19 need not be provided as a one-stage amplifier, as it is indicated in FIG. 1.

Figure 2:
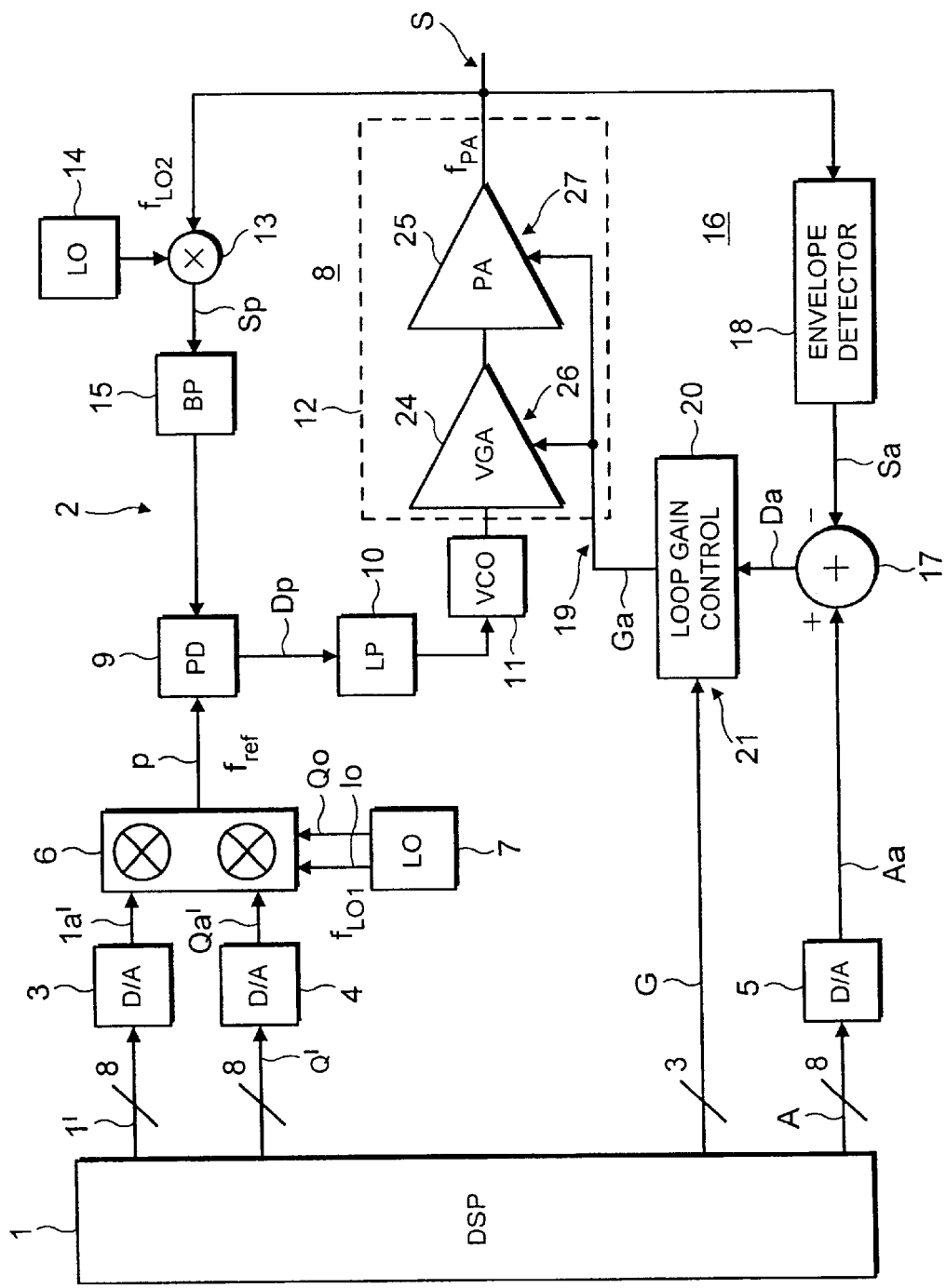
FIG. 2 schematically shows the circuitry in FIG. 1, with a loop amplifier in the amplitude feedback loop, and a power amplifier comprising a variable gain amplifier.

FIG. 2 shows a preferred embodiment of the circuit in FIG. 1. In FIG. 2, the power amplifier 12 is provided as a two-stage circuit comprising a variable gain amplifier 24 acting as a pre-amplifier as well as a regular power amplifier 25. According to the invention, both these amplifiers 24 and 25 are preferably equipped with gain control inputs 26 and 27, respectively, as shown in FIG. 2.

In this way, the utilized gain range per stage may be made narrower, permitting use of simpler amplifiers 24 and 25 with narrower gain ranges. For example, in certain power amplifier stages 25 having otherwise desirable characteristics, the gain tend to drop to near zero for very small or very large signal amplitudes.

It would require rather much from the amplitude feedback loop 16 to compensate for such high variations in the gain of the power amplifier 12. By dividing the power amplifier 12 into two amplifier stages 24 and 25 as shown in FIG. 2, each of these stages need only be controlled through a gain range of, in principle, the square root of the desired, total gain range of the whole power amplifier 12. Dividing the power amplifier 12 in more than two stages of course is within the scope of the present invention as well.

In FIG. 2, the gain of the amplitude feedback loop 16 is made controllable by inserting a loop amplifier 20 in the feedback path of the amplitude feedback loop 16.

The amplitude linearity of the power amplifier (from the analog amplitude signal Aa to the output signal amplitude S) and the stability of the amplitude feedback loop 16 are dependent on the loop gain of this loop. The higher the loop gain in the amplitude feedback loop, the better the amplitude linearity and the poorer the loop stability.

In general, the loop gain has to be kept below a certain fraction of that loop gain which causes instability in the loop. The difference between the fraction and the loop gain value causing instability is often referred to as the stability margin. In order to obtain "clean" and well controlled output signals, the stability margin has to be kept above a certain value.

Now, according to the invention, the gain of the loop amplifier 20 is controlled in dependency of the amplitude of the output signal S so as to obtain a loop gain in the amplitude feedback loop 16 of substantially constant value.

Preferably, the loop amplifier 20 has its gain controllable by means of a gain control signal G which is present on a gain control input 21 of the amplifier 20.

The loop amplifier 20 now amplifies the amplitude difference signal Da by a factor corresponding to the gain control signal G, into a power amplifier gain control signal Ga to be coupled to the gain control input 19 of the power amplifier 12.

When the gain characteristics of the power amplifier 12 and of the loop amplifier 20 are known, it is possible to determine for each level of the desired amplitude of the output signal S, a value of the gain control signal G which renders the loop gain substantially constant at a desired level.

This however defines a relationship between the desired amplitude of the output signal S and a corresponding value of the gain control signal G. Thus, this relationship may according to the invention be implemented within the digital signal processor 1 so that the processor supplies a gain control signal G which is constantly adjusted to obtain a loop gain of substantially constant value as well as a satisfactory stability margin, even if the value of the output signal amplitude and hence the gain of the power amplifier 12 is varying considerably.

In the embodiment in FIG. 2, the gain control signal is by way of example provided by the digital signal processor 1 in the form of an 8-bit word.

Technically simple, power efficient and economically profitable power amplifiers of the state of the art often have amplitude gains which are varying highly with the amplitude level of the amplifier output, and amplitude modulated output signals of high quality from such amplifiers will not be obtainable without appropriate countermeasures.

On the other hand, the prospective savings in cost as well as power consumption using such amplifiers might be considerable.

By the measures of the invention thus described, the amplitude linearity of the power amplifier 12 is controlled efficiently by the amplitude feedback loop 16. This permits use of a power amplifier of quite poor amplitude linearity, provided it has a possibility of real-time gain control.

In practice, experiments and modelling have proved that power amplifiers 12 of quite poor amplitude linearity may be used in the circuit of FIG. 2, with very satisfactory results indeed.

Further, experiments have indicated that the accuracy of the loop gain value need not be very high. Thus, according to the invention, the relationship between the desired amplitude of the output signal S and a corresponding value of the gain control signal G may be implemented in the form of an internal look-up table in the digital signal processor, and in order to save memory space, the look-up table may be quantified in that for a certain value interval of the independent variable (here: the desired amplitude of the output signal S), one and only one value of the dependent variable (here: the value of the gain control signal G) is put out from the table.

In addition, to further simplify matters, according to the invention, the contents of the look-up table may be determined from measurements on one or few sample power amplifiers of the type to be used in the application in question. Experiments have shown that the deviations as to amplitude linearity characteristics from sample to sample of power amplifiers tend to be negligible in the present context.

Figure 3:
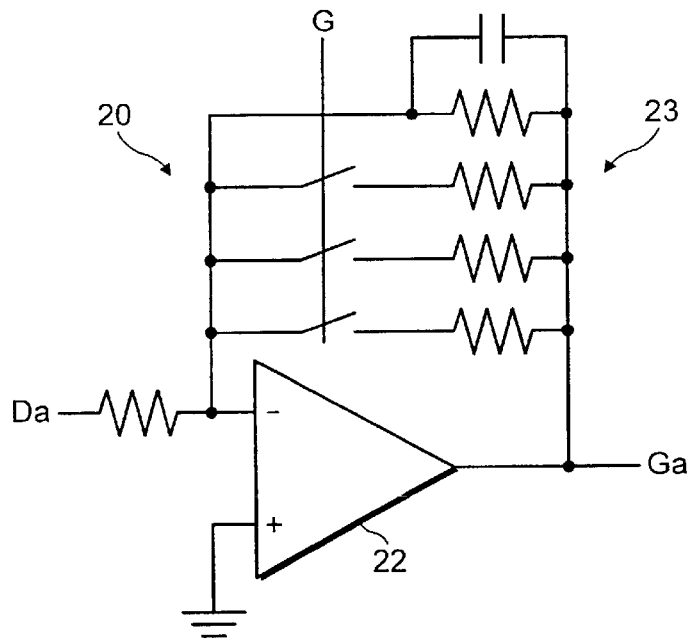
FIG. 3 schematically shows a loop amplifier for use in the circuitry in FIG. 2.

In FIG. 3, a simple and advantageous implementation of an inverting, controllable gain amplifier suitable for use as the loop amplifier 20, is shown. For the sake of simplicity, it is assumed in FIG. 3 that the gain control signal G is a 3-bit word. Each of the three bits control one of the three switches shown, which engage each their feedback resistor of an inverting amplifier 22. By closing appropriate switches, a desired resulting resistance value of the feedback resistor network 23 and hence a desired gain of the amplifier 20 is obtained.

In fact, the loop amplifier 20 in FIG. 3 has a digital control input which in the embodiment shown receives a digital signal in the form of a 3-bit word G(t) as its control signal. This digital signal might preferably be supplied directly by the digital signal processor 1, as indicated in FIG. 2.

As an alternative (not shown) to the digitally controllable gain amplifier in FIG. 3, an analog multiplier (or: Gilbert-mixer) may be utilized for the loop amplifier 20. Such a multiplier will have its analog output voltage proportional to the product of the values of its two analog input voltages. Then, the resulting gain from a first input to the output will be proportional to the analog voltage on a second input.

This alternative, of course, will necessitate a digital-to-analog conversion of the gain control signal G into an analog signal to be coupled to said second input of the analog multiplier. The amplitude difference signal Da is then coupled to the first input, and the power amplifier gain control signal Ga taken from said output of the analog multiplier.

Figure 4:
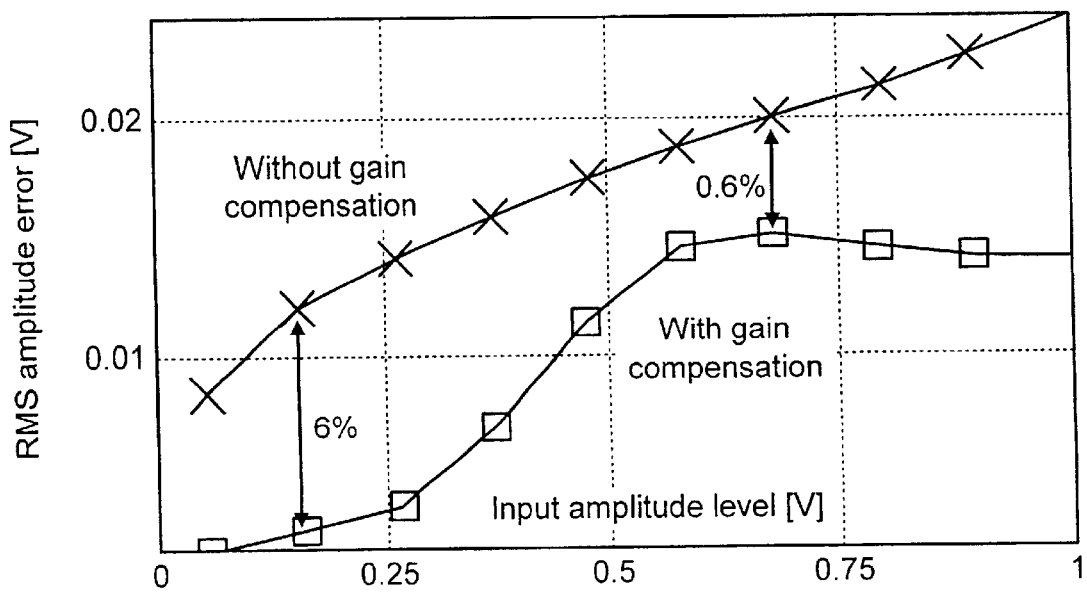
FIG. 4 is a graph showing the RMS voltage error of the output signal from the circuit of FIG. 1 plotted as a function of the input amplitude level, with and without amplitude feedback loop gain control.

In FIG. 4, results from a model simulation of a power amplifier 12 in an amplifier according to the invention are plotted in a graph. In the simulation in question, an amplitude feedback loop 16 was simulated, with the loop gain controlled by means of a loop amplifier 20, and without such loop gain control, respectively.

In the simulation, the gain characteristic of the power amplifier 12 was chosen so that the gain was set to approach zero for very small and for very large signal amplitudes, due to compression and turn-off phenomena. This corresponds to the conditions when using one of several common types of simple and power efficient power amplifiers 12.

The value of the gain control signal G was quantified to 4 bits, giving a minimum value of 1 and a maximum value of 5. The maximum DC loop gain was 20.

A test signal of a certain duration, amplitude as well as phase modulated, was defined in the form of a time-dependent (I and Q)-vector. This signal was split into a time-dependent (I',Q' and A)-signal, and applied to said simulated circuit. Nine simulations were made, with the test signal at nine different amplitude maximum levels.

The RMS amplitude error voltages as functions of the test signal amplitude level is shown in the graph in FIG. 4. In FIG. 4, the abscissa is the relative maximum amplitude level of the test signals, and the ordinate is the corresponding RMS amplitude errors.

The curve "×" shows the RMS amplitude error without loop gain control, and the curve "□" shows the RMS amplitude error with loop gain control ("Gain Compensation") in the amplitude loop.

At two amplitude levels, the difference between the RMS error voltages without and with gain control respectively, is indicated. At approximately 0.15 V maximum input amplitude level, this difference amounts to 6% of the maximum input amplitude level, and at approximately 0.70 V maximum input amplitude level, the difference amounts to 0.6% of the maximum input amplitude level.

A considerable improvement is thus observed for all maximum amplitude levels, even though both systems have the same maximum loop gain and stability margin. For low amplitudes, the improvement of more than 6% RMS is observed.

The aspects and the embodiments of the invention have been explained above in general terms to illustrate the general utility of the invention in areas where accurate analog power amplification of digitally processed signals is needed. However, the use of the invention in the area of cellular telephony is particularly advantageous, in particular for the following reasons.

In mobile telephony, the need for information throughput is steadily increasing. The use of combined amplitude and phase modulation enables a higher information transfer per channel as compared to systems with only phase modulation such as for example the original GSM system. Such higher data rates are needed in coming generations of cellular telephony, as well as in planned extensions of the GSM system.

The present invention provides systems, methods, circuits and uses which enable higher information data rates in cellular telephone channels.

As cellular telephones are highly price sensitive products due to the heavy competition on the market, it is essential that the electronic circuits in the telephones be manufactured as cost effectively as possible. This requires a low component count and few analog circuits which might require trimming or adjustment. These objectives are met by the invention, as has been explained above.

Also, power consumption of a cellular telephone is a specific competition parameter, because low power consumption reduces battery weight and/or increases service time of the telephone. The invention contributes to a low power consumption of a cellular telephone.

These facts make the use of the different aspects of the invention explained above very advantageous in cellular telephones as well as in other mobile radio transmitter equipment.

Even if reference is made above merely to phase modulation and to a phase locked loop, nothing prevents the method, the digital signal set, the radio transmitter or the uses according to the invention to be utilized with use of frequency modulation instead of phase modulation, and a frequency linearizing feedback loop instead of a phase locked loop.

What is claimed is:

1. A method for transforming modulation information from a digital signal processing system into analog signals suitable for controlling analog modulator and amplifier circuitry, the information comprising amplitude modulation information as well as phase or frequency modulation information for compound modulating a carrier wave, the method comprising the steps of:

providing a first and a second digital signal representing a desired phase angle of the carrier wave;

converting each of the first and second digital signals into corresponding first and second analog signals;

mixing the first and second analog signals with first and second oscillator signals to obtain an analog, phase or frequency modulated signal;

providing a third digital signal corresponding to the desired amplitude of the carrier wave;

converting the third digital signal into a corresponding analog amplitude signal; and feeding the analog phase or frequency modulated signal and the analog amplitude signal to the analog modulator and amplifier circuitry.

2. A method according to claim 1, wherein each of the first and second digital signals corresponds to a respective component of a desired phase unit vector in a cartesian coordinate system.

3. A method according to claim 1, wherein each of the first and second analog signals correspond to a respective component of a desired phase unit vector in a cartesian coordinate system.

4. A method according to claim 2, wherein the first and second oscillator signals are in quadrature.

5. A method according to claim 1, wherein the analog, phase or frequency modulated signal has a constant amplitude.

6. A use of the method of claim 1 in a mobile radio transmitter.

7. A radio transmitter according to claim 6, wherein the power amplifier forms part of said amplitude control loop.

8. A method according to claim 3, wherein the first and second oscillator signals are in quadrature.

9. A method according to claim 2, wherein the analog, phase or frequency modulated signal has a constant amplitude.

10. A method according to claim 3, wherein the analog, phase or frequency modulated signal has a constant amplitude.

11. A method according to claim 4, wherein the analog, phase or frequency modulated signal has a constant amplitude.

12. A radio transmitter comprising:

a digital signal processing system, analog signal processing circuitry and an analog output stage;

first and second digital-to-analog conversion circuits for converting first and second digital quadrature signals from the digital signal processing system into corresponding first and second analog quadrature signals;

a first mixer circuit with an associated first local oscillator circuit for mixing the first and second analog quadrature signals with first and second quadrature signals from the first local oscillator into a constant amplitude, phase or frequency modulated driver signal;

frequency converter circuitry for converting the driver signal to a desired output frequency band;

a power amplifier for amplifying the converted signal into a transmitter output signal;

a third digital-to-analog conversion circuit for converting a digital amplitude signal from the digital signal processing system into a corresponding analog amplitude signal; and an amplitude modulating circuit for modulating the amplitude of the transmitter output signal in dependency on the analog amplitude signal.

13. A radio transmitter according to claim 12, wherein the frequency converter circuitry together with the power amplifier forms form part of a phase locked loop.

14. A radio transmitter according to claim 13, wherein the frequency converter circuitry comprises in a main signal path a voltage controlled oscillator controlling a power amplifier, and in a divider circuit in a feedback path.

15. A radio transmitter according to claim 13, wherein the frequency converter circuitry comprises in a main signal path a voltage controlled oscillator controlling a power amplifier, and a second mixer circuit with an associated second local oscillator circuit in a feedback path.

16. A radio transmitter according to claim 12, wherein the amplitude modulating circuit comprises a closed amplitude control loop.

17. A use of the radio transmitter of claim 14 in mobile equipment.

18. A radio transmitter according to claim 13, wherein the amplitude modulating circuit comprises a closed amplitude control loop.

19. A radio transmitter according to claim 14, wherein the amplitude modulating circuit comprises a closed amplitude control loop.

20. A radio transmitter according to claim 15, wherein the amplitude modulating circuit comprises a closed amplitude control loop.

* * * * *